(12) United States Patent
Shohhara (10) Patent No.: US 10,150,408 B2
(45) Date of Patent: Dec. 11, 2018

(54) ILLUMINATION DEVICE

(71) Applicant: YAZAKI CORPORATION, Tokyo (JP)

(72) Inventor: Kazuhiro Shohhara, Makinohara (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/417,453

(22) Filed: Jan. 27, 2017

(65) Prior Publication Data

US 2017/0136945 A1 May 18, 2017

Related U.S. Application Data (63) Continuation of application No. PCT/JP2015/071352, filed on Jul. 28, 2015.

(30) Foreign Application Priority Data

Jul. 28, 2014 (JP) .................................. 2014-152987

(51) Int. Cl.
*H02G 5/00* (2006.01)
*F21V 15/01* (2006.01)
(Continued)

(52) U.S. Cl.
CPC .............. *B60Q 3/20* (2017.02); *F21V 14/02* (2013.01); *F21V 15/012* (2013.01); *F21V 19/00* (2013.01);
(Continued)

(58) Field of Classification Search
CPC . B60Q 3/233; B60Q 3/51; B60Q 3/53; B60Q 3/54; B60Q 3/56; H02G 5/005;
(Continued)

(56) References Cited

U.S. PATENT DOCUMENTS 5,101,326 A * 3/1992 Roney ................. B60Q 1/2615
362/545
7,083,311 B2 * 8/2006 Schreck ............... B60Q 1/2607
362/487

(Continued)

FOREIGN PATENT DOCUMENTS

CN  102213372 A  10/2011
CN  102606936 A   7/2012

(Continued)

OTHER PUBLICATIONS

Written Opinion dated Nov. 2, 2015, issued by the International Searching Authority in counterpart International Application No. PCT/JP2015/071352 (PCT/ISA/237).

(Continued)

*Primary Examiner* — Alan B Cariaso
(74) *Attorney, Agent, or Firm* — Sughrue Mion, PLLC (57) ABSTRACT

An illumination device includes a light emitting element, a bus bar in which the light emitting element is attached, and a housing in which the bus bar is insert-molded. The bus bar includes a bus bar main body which is flat-plate-shaped and a bent piece extended in the bus bar main body and bent so as to be inclined to the bus bar main body. The housing includes a protruding part which protrudes from a surface covering the bus bar main body so as to cover at least a part of the bent piece and which has an inclined surface parallel to the bent piece, and a hole on the inclined surface of the protruding part formed so that the bent piece is exposed. The light emitting element is attached to the bent piece so as to be accommodated in the hole.

3 Claims, 12 Drawing Sheets

(51) Int. Cl.
*F21V 19/00* (2006.01)
*B60Q 3/20* (2017.01)
*H01L 33/62* (2010.01)
*F21V 14/02* (2006.01)
*F21V 23/06* (2006.01)
*H05K 1/18* (2006.01)
*F21Y 107/50* (2016.01)
*F21Y 115/10* (2016.01)

(52) U.S. Cl.
CPC .......... *F21V 19/0015* (2013.01); *F21V 23/06* (2013.01); *H01L 33/62* (2013.01); *H02G 5/005* (2013.01); *H05K 1/183* (2013.01); *F21Y 2107/50* (2016.08); *F21Y 2115/10* (2016.08); *H05K 2201/09045* (2013.01); *H05K 2201/09072* (2013.01); *H05K 2201/0999* (2013.01); *H05K 2201/10106* (2013.01); *H05K 2201/10272* (2013.01)

(58) Field of Classification Search
CPC ............ F21Y 2107/50; F21Y 2107/70; F21V 15/012; F21V 19/00; F21V 19/001; F21V 19/0015; F21S 4/20; F21S 4/22; F21S 4/28
USPC ................. 361/675; 174/70 B, 71 B, 85, 87; 362/490
See application file for complete search history.

(56) References Cited

U.S. PATENT DOCUMENTS

| | | |
|---|---|---|
| 2003/0174477 A1 | 9/2003 | Ohtani et al. |
| 2004/0253855 A1 | 12/2004 | Schreck et al. |
| 2010/0157595 A1 | 6/2010 | Lin et al. |
| 2011/0111539 A1* | 5/2011 | Lai .......................... H01L 33/641 438/27 |
| 2012/0153865 A1* | 6/2012 | Rolfes .................... F21V 23/003 315/294 |
| 2013/0039063 A1* | 2/2013 | Quaal ...................... F21V 31/04 362/235 |
| 2013/0058090 A1* | 3/2013 | Ferrie ...................... F21V 3/04 362/249.02 |
| 2013/0107497 A1 | 5/2013 | Lin |
| 2013/0005055 A1 | 6/2013 | Lin et al. |
| 2014/0247595 A1* | 9/2014 | Lind .................... G09F 13/0404 362/249.04 |
| 2015/0116990 A1* | 4/2015 | Cassidy .................... F21V 5/04 362/126 |

FOREIGN PATENT DOCUMENTS

| | | | |
|---|---|---|---|
| EP | 1632711 A2 * | 3/2006 | ........... B60Q 1/2696 |
| JP | 2003-304039 A | 10/2003 | |
| JP | 2006093359 A | 4/2006 | |
| JP | 2010-153800 A | 7/2010 | |

OTHER PUBLICATIONS

Int. Search Report dated Nov. 2, 2015 issued in Application No. PCT/JP2015/071352 (PCT/ISA/210).
Communication dated Apr. 3, 2018, issued by the Japanese Patent Office in counterpart Japanese application No. 2014-152987.
Communication dated Jul. 2, 2018, issued by the State Intellectual Property Office of P.R. China in counterpart Chinese Application No. 201580041425.X.

* cited by examiner

ILLUMINATION DEVICE

CROSS REFERENCE TO RELATED APPLICATIONS

This application is a continuation of PCT application No. PCT/JP2015/071352, which was filed on Jul. 28, 2015 based on Japanese Patent Application (No. 2014-152987) filed on Jul. 28, 2014, the contents of which are incorporated herein by reference.

BACKGROUND OF THE INVENTION

Field of the Invention

The present invention relates to an illumination device attached to, for instance, a ceiling of a vehicle such as a motor vehicle.

Description of Related Art

To the ceiling of a vehicle such as a motor vehicle, an illumination device for illuminating an interior is attached. Ordinarily, the illumination device includes a case, a circuit board and a wiring member such as a bus bar attached to the case and a light emitting element such as an LED mounted on the wiring member.

On the other hand, an electronic component such as the light emitting element may be sometimes attached to a lead frame board having a lead frame sealed by a resin (for instance, see patent literature 1).

[Patent Literature 1] JP-A-2003-304039

Since the above-described illumination device has a structure in which the wiring member as a member separate from the case is attached to the case, the illumination device is limited to its compactness or miniaturization. As one method of the miniaturization, the lead frame board as disclosed in the patent literature 1 may be supposed to be used.

On the other hand, in the illumination device provided in the interior of the motor vehicle, the light emitting element may be possibly requested to be mounted on the board in such a way that the light emitting element is inclined to the board so that the light emitting element may face an object to be illuminated in order to apply illumination lights to the object to be illuminated with a high directivity. However, when the light emitting element is merely mounted on the lead frame board, the light emitting element is hardly inclined relative to the board.

SUMMARY

One or more embodiments provide an illumination device in which a miniaturization is easy and illumination lights can be directed to a desired direction.

Solution to Problem

In accordance with one or more embodiments, an illumination device according to the present invention is characterized by below-described (1) to (5).

In an aspect (1), one or more embodiments provide an illumination device including a light emitting element, a bus bar in which the light emitting element is attached, and a housing in which the bus bar is insert-molded. The bus bar includes a flat plate shaped bus bar main body and a bent piece extended in the bus bar main body and bent so as to be inclined to the bus bar main body. The housing includes a hole formed so that the bent piece is exposed on a surface located in a direction where the bent piece is bent. The light emitting element is attached to the bent piece so as to be accommodated in the hole.

In an aspect (2), in the illumination device of one or more embodiments, the housing may include a protruding part which protrudes from the surface so as to cover at least a part of the bent piece and which has an inclined surface parallel to the bent piece. The light emitting element may be attached to the bent piece so as to be accommodated in the hole formed on the inclined surface.

In an aspect (3), in the illumination device of one or more embodiments, the hole may have a form expanding from an inner edge located in a bent piece side to an inner edge located in an inclined surface side.

In an aspect (4), in the illumination device of one or more embodiments, the light emitting element may be attached so as to be biased to a position of a lower side along the inclined surface, in the hole formed on the inclined surface.

In an aspect (5), in the illumination device of one or more embodiments, the housing may include a hole formed so that the bent piece is exposed in a back surface located in an opposite direction to the direction in which the bent piece is bent.

According to the aspect (1), as compared with the structure in which the circuit board as the separate member or the wiring member such as the bus bar is attached to the case, the wiring member as the separate member is not necessary. Further, housing can be arranged near the bus bar. Accordingly, the illumination device can be easily made to be compact. Further, the illumination device of this structure has a structure in which the bent piece inclined to the bus bar main body is provided, which is different from a flat plate shaped lead frame board, and the light emitting element is accommodated in and attached to the hole to which the bent piece is exposed. Accordingly, the light emitting element can be easily mounted so as to be inclined to the bus bar and the light emitting direction of the light emitting element can be adjusted to a desired direction.

According to the aspect (2), since the protruding part may be provided only in a position where the bent piece is located to increase the thickness of the housing, the thickness of an entire part of the housing does not need to be increased. Accordingly, the housing can be miniaturized and a low cost can be achieved.

According to the aspect (3), when the light emitting element is accommodated in the hole, the light emitting element is guided to a prescribed attaching position by the tapered inner surface of the hole. Accordingly, an accommodating operation of the light emitting element in the hole is easy, so that an efficiency of an assembling operation can be enhanced.

According to the aspect (4), the light emitting element is attached so as to be biased to a position of a lower side along the inclined surface in the hole formed in the inclined surface. Accordingly, when the light emitting element is soldered to the bus bar by a re-flow method, molten solder is allowed to flow to the lower side of the hole, so that a contact area of the light emitting element and the solder can be increased. Accordingly, the light emitting element can be more assuredly connected to the bus bar.

According to the aspect (5), since the hole in which the bent piece in the housing is exposed is formed in a back surface located in an opposite direction to the direction in which the bent piece is bent, heat discharged from the light emitting element can be efficiently radiated from the hole through the bent piece.

According to one or more embodiments, an illumination device can be provided in which a miniaturization is easy and illumination lights can be directed to a desired direction.

As mentioned above, the present invention is briefly described. Further, when modes for carrying out the present invention (refer them to as "embodiments", hereinafter) which will be described below are read by referring to the attached drawings, a detail of the present invention will be more clarified.

BRIEF DESCRIPTION OF THE DRAWINGS

FIGS. 1A and 1B are views which explain an illumination device according to an embodiment.

FIGS. 2A and 2B is a view which explains the illumination device according to the embodiment.

DETAILED DESCRIPTION

Now, examples of embodiments (a first embodiment and a second embodiment) according to the present invention will be described below by referring to the drawings.

First Embodiment (Structure of Illumination Device)

Initially, a structure of an illumination device according to a first exemplary embodiment will be described below.

Figure 1A:
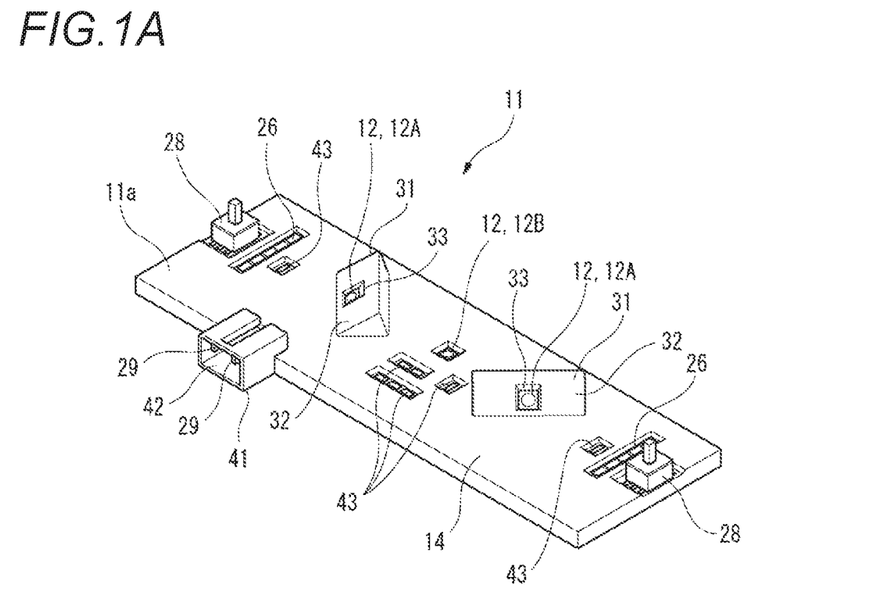
FIG. 1A is a perspective view of the illumination device and FIG. 1B is a perspective view of the illumination device seeing through housing.
Figure 1B:
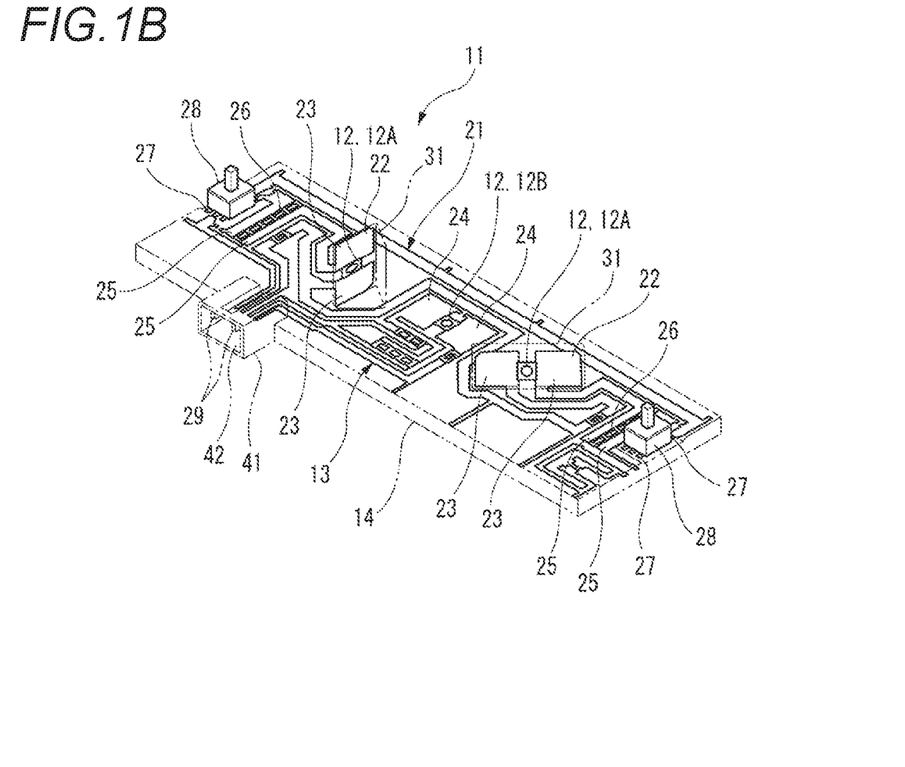
Figure 2A:
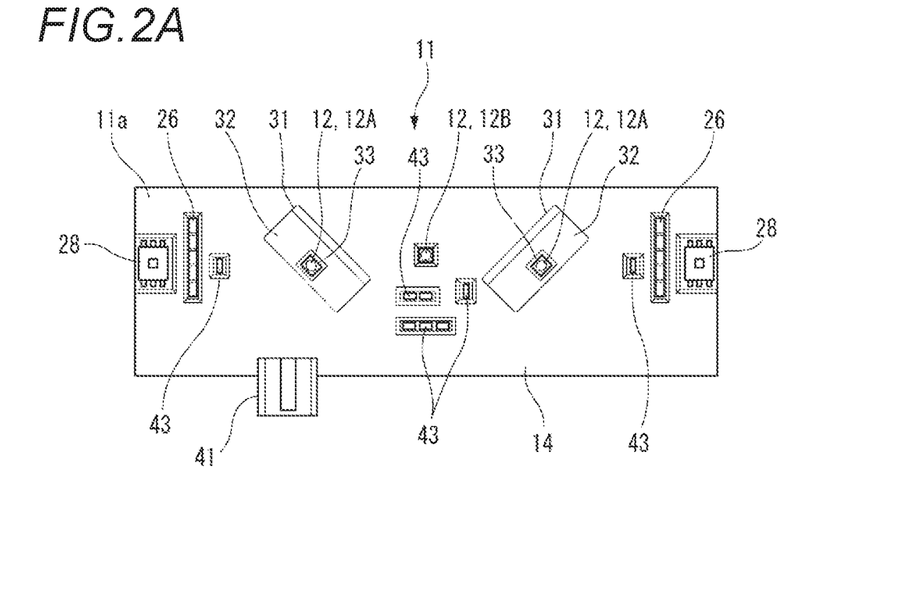
FIG. 2A is a plan view of the illumination device and FIG. 2B is a plan view of the illumination device seeing through the housing.
Figure 2B:
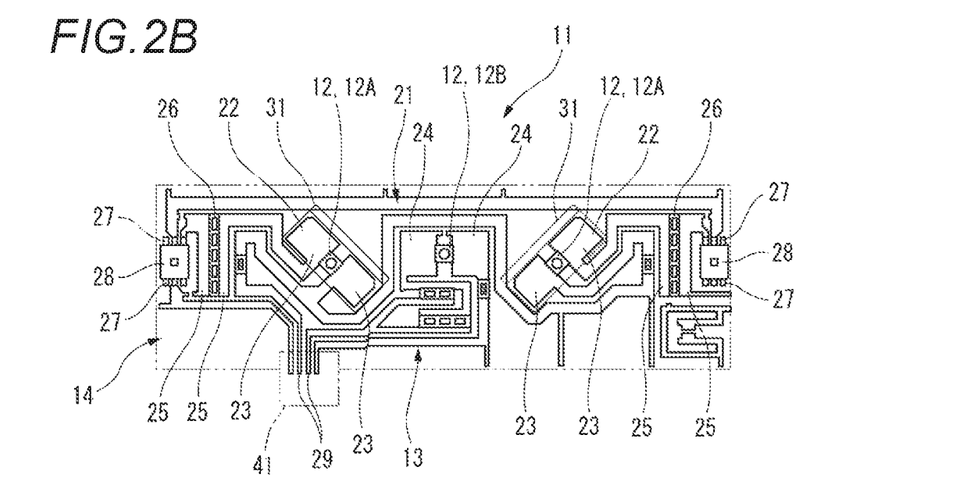

FIGS. 1A and 1B are views which explain an illumination device according to an embodiment. FIG. 1A is a perspective view of the illumination device and FIG. 1B is a perspective view of the illumination device seeing through housing. FIGS. 2A and 2B are views which explain the illumination device according to the embodiment. FIG. 2A is a plan view of the illumination device and FIG. 2B is a plan view of the illumination device seeing through the housing.

As shown in FIGS. 1A and 1B and FIGS. 2A and 2B, the illumination device 11 according to the embodiment includes a light emitting element 12, a bus bar 13 and a housing 14. The illumination device 11 is attached to a ceiling of a vehicle so that a surface side 11a thereof is directed to an interior side of the vehicle.

The light emitting element 12 includes an LED (a Light Emitting Diode) to emit lights when an electric power is fed and output illumination lights. The light emitting element 12 is provided in a surface 11a as a surface of the interior side in the illumination device 11. The light emitting element 12 includes a light emitting element 12A for illuminating a seat and a light emitting element 12B for illuminating a vehicle interior. Specifically, the two light emitting elements 12A for illuminating the seats are provided so as to sandwich a central part in a longitudinal direction on the surface 11a of the illumination device 11 between them. The light emitting element 12B for illuminating the vehicle interior is provided in the central part in the longitudinal direction on the surface 11a of the illumination device 11. The light emitting elements 12A for illuminating the seats are respectively light sources of illumination tools (what is called, map lights) which respectively illuminate a driver's seat and an assistant's seat. The light emitting element 12B for illuminating the vehicle interior is a light source of an illumination tool (a room lamp) which illuminates the vehicle interior.

The bus bar 13 is formed with a metal plate having an electric conductivity, for instance, copper or copper alloy. The bus bar 13 is a wiring for feeding an electric power to the light emitting element 12 and has a prescribed wiring pattern. The bus bar 13 includes a bus bar main body 21 and two bent pieces 22 provided in the bus bar main body 21. The bus bar main body 21 is configured in a flat plate form. The bent piece 22 is extended in the bus bar main body 21. The bent piece 22 is bent so as to be inclined to the bus bar main body 21.

Figure 3:
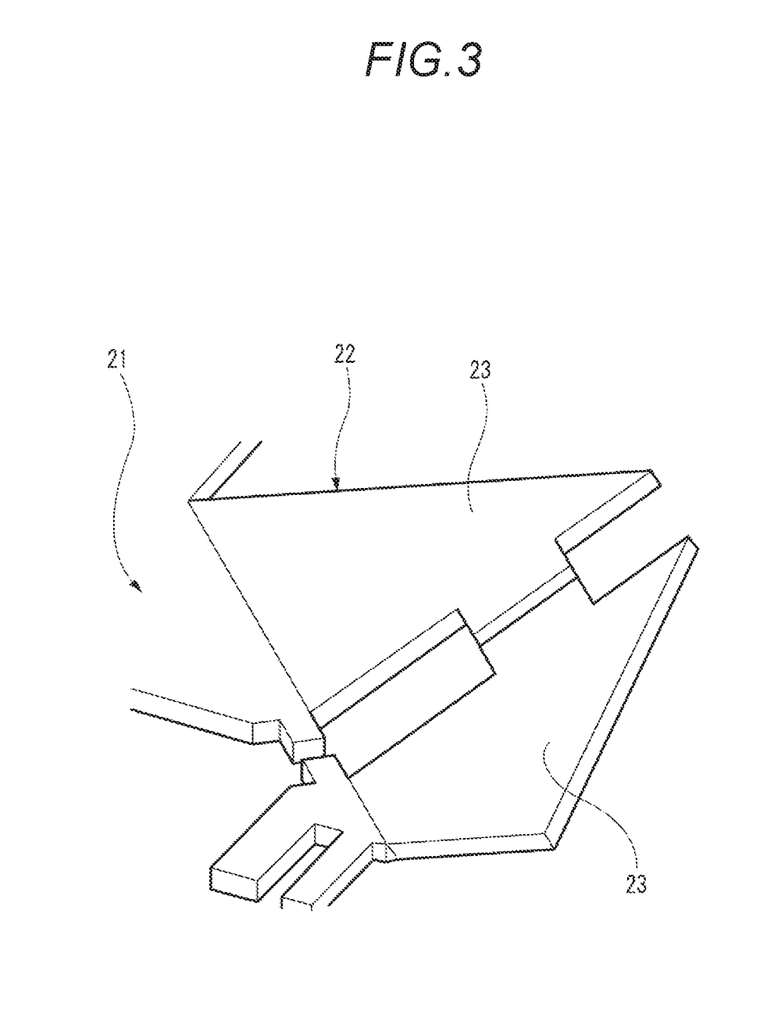
FIG. 3 is a perspective view of a bent piece of a bus bar.
Figure 4:
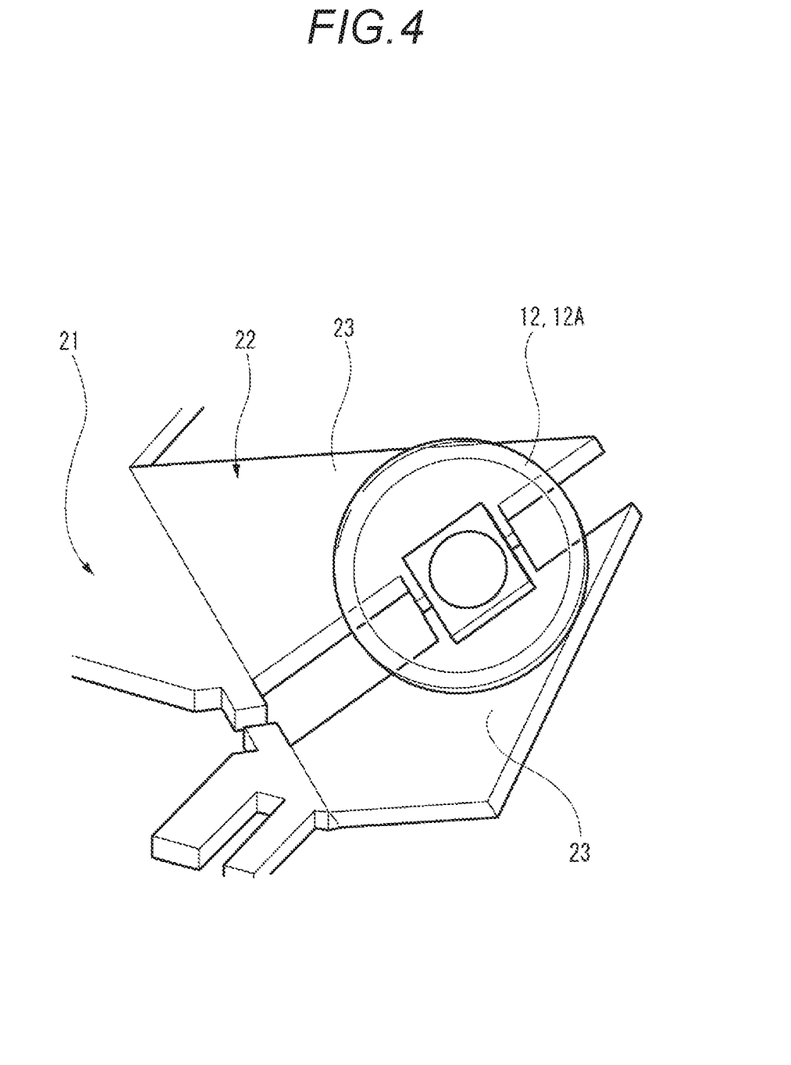
FIG. 4 is a perspective view of the bent piece of the bus bar on which a light emitting element is mounted.

FIG. 3 is a perspective view of the bent piece of the bus bar. FIG. 4 is a perspective view of the bent piece of the bus bar on which the light emitting element is mounted.

As shown in FIG. 3 and FIG. 4, the bent piece 22 has one pair of electrode plate parts 23. The electrode plate parts 23 are arranged so as to be spaced from each other. The light emitting element 12A for illuminating the seat is provided so as to stride over the electrode plate parts 23 and soldered to the electrode plate parts 23 respectively. The light emitting element 12A for illuminating the seat emits lights when the electric power is fed thereto through the electrode plate parts 23.

The bus bar main body 21 has one pair of electrode plate parts 24 at a position to which the light emitting element 12B for illuminating the vehicle interior is attached. The electrode plate parts 24 are arranged so as to be spaced from each other. The light emitting element 12B for illuminating the vehicle interior is provided so as to stride over the electrode plate parts 24 and soldered to the electrode plate parts 24 respectively. The light emitting element 12B for illuminating the vehicle interior emits lights when the electric power is fed thereto through the electrode plate parts 24.

Figure 5:
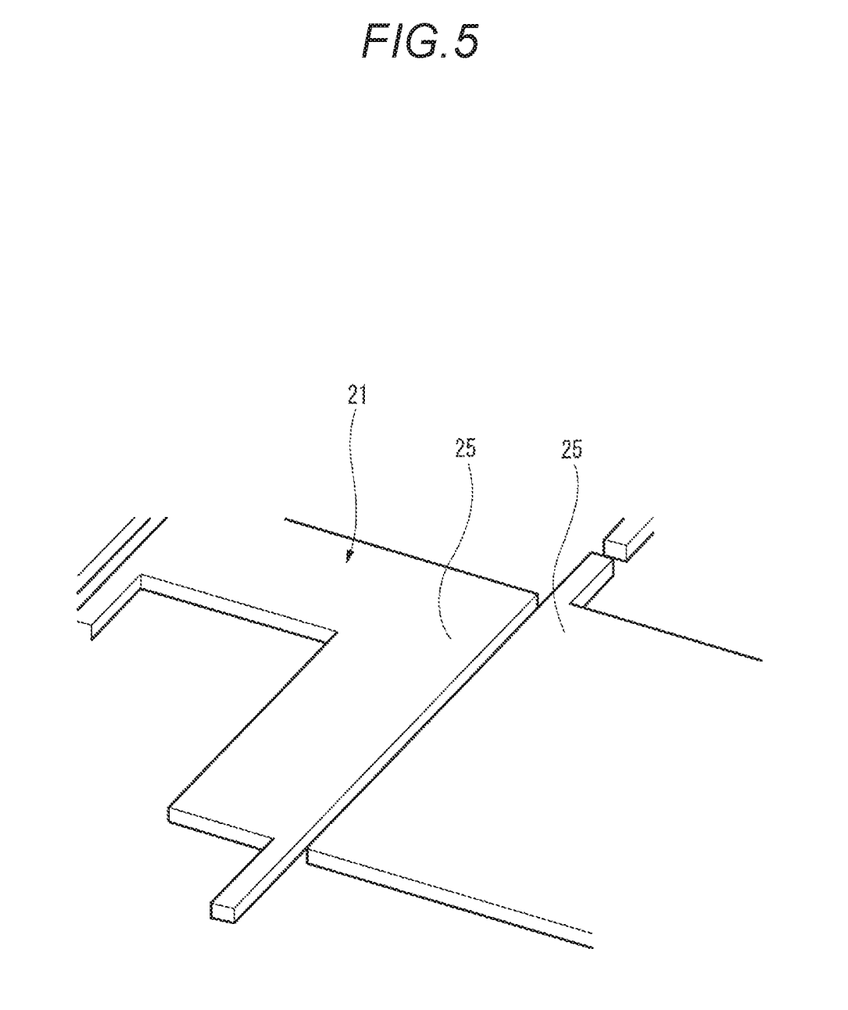
FIG. 5 is a perspective view of an electrode plate part of the bus bar.
Figure 6:
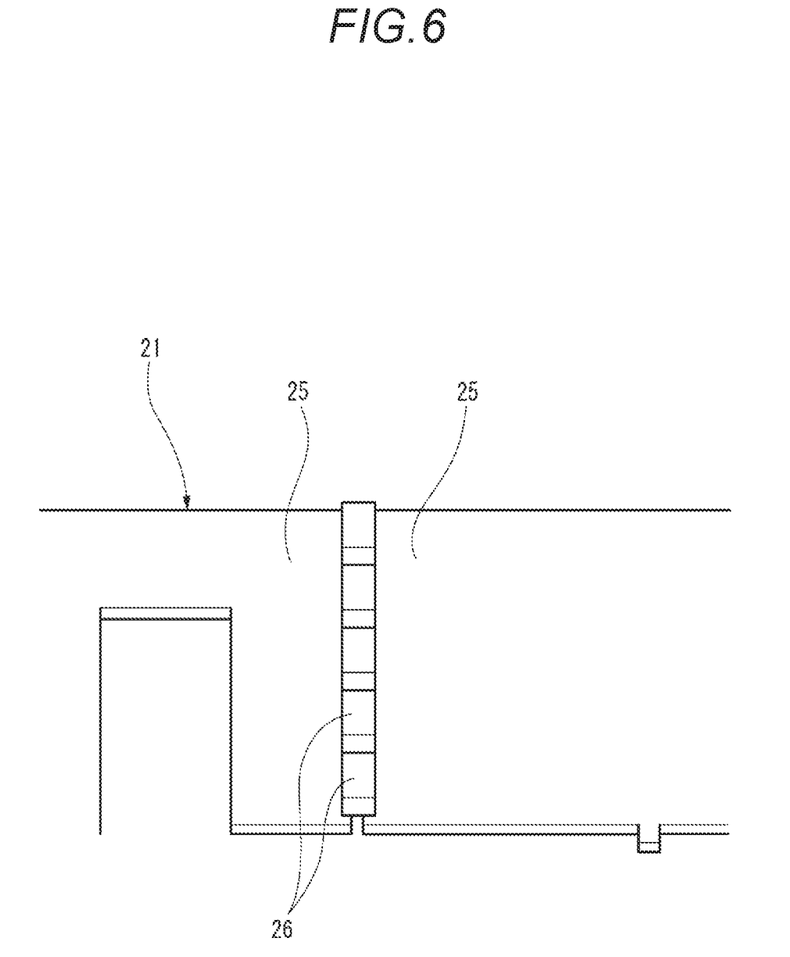
FIG. 6 is a plan view of the electrode plate part of the bus bar on which a chip resistance is mounted.

FIG. 5 is a perspective view of the electrode plate part of the bus bar. FIG. 6 is a plan view of the electrode plate part of the bus bar on which a chip resistance is mounted.

The bus bar main body 21 has electrode plate parts 25 in the vicinity of both ends of the illumination device 11. As shown in FIG. 5 and FIG. 6, the electrode plate parts 25 are arranged so as to be spaced apart from each other. In the electrode plate parts 25, a plurality of chip resistances 26 are provide so as to stride over them. The chip resistances 26 are soldered to the electrode plate parts 25 respectively.

Further, the bus bar main body 21 has terminal parts 27 for switches at both the end parts of the illumination device 11. In the terminal parts 27 for the switches, illuminating switches 28 are provided. Terminals of the illuminating switches 28 are soldered to the terminal parts 27 for the switches of the bus bar main body 21. The illuminating switches 28 are respectively push-down type switches. When the illuminating switches 28 are operated, the light emitting elements 12A for the seats are turned on or off.

Further, in the bus bar main body 21, connection terminal parts 29 are formed. The connection terminal parts 29 are extended sideward from a part of a peripheral edge in the bus bar main body 21.

The housing 14 is formed with a synthetic resin and integrally formed with the bus bar 13 by insert-molding the bus bar 13. Most of a periphery of the bus bar 13 is covered with the housing 14.

Figure 7:
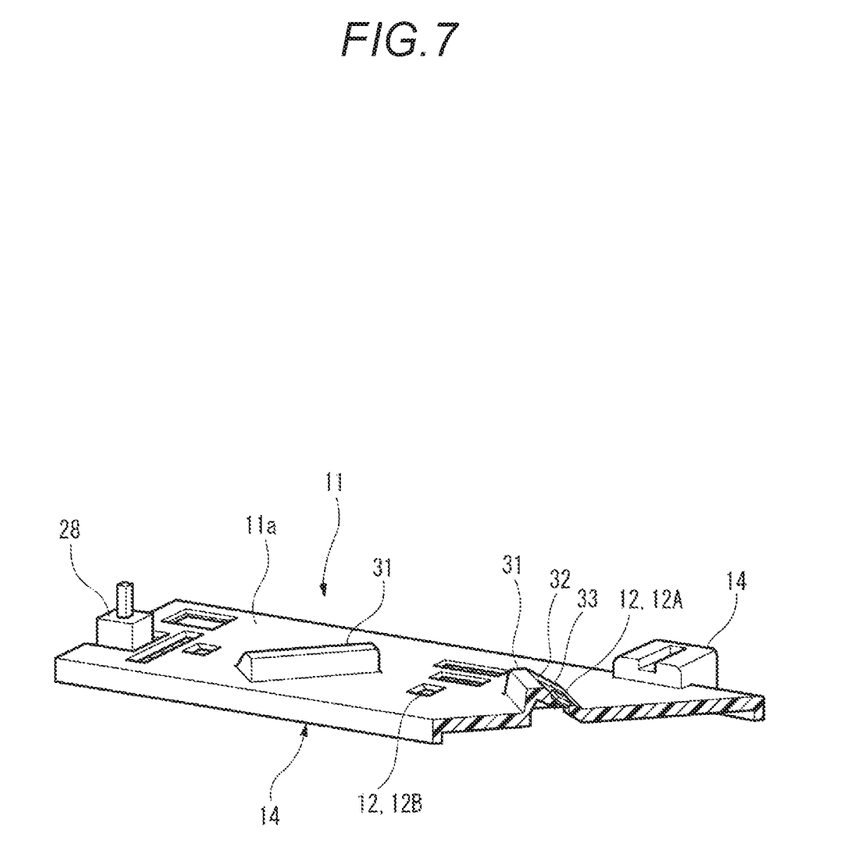
FIG. 7 is a perspective view with apart of the illumination device seen in section.
Figure 8:
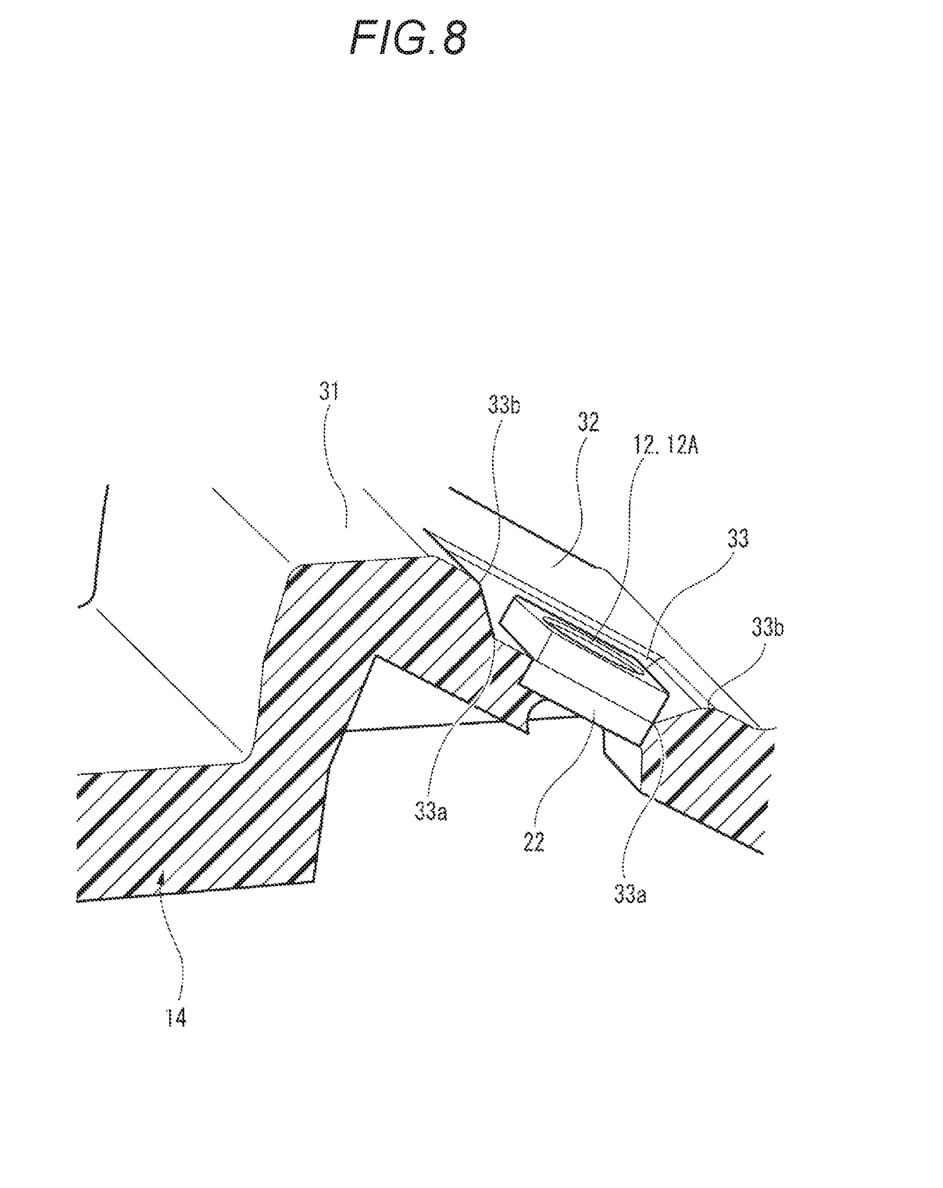
FIG. 8 is a partly perspective view with a protruding part of the housing seen in section.

FIG. 7 is a perspective view with a part of the illumination device seen in section. FIG. 8 is a partly perspective view with a protruding part of the housing seen in section.

As shown in FIG. 7, the housing 14 has a protruding part 31. The protruding part 31 protrudes from the surface 11a so as to cover the bent piece 22 of the bus bar 13. The protruding part 31 has an inclined surface 32. The inclined surface 32 is formed so as to be parallel to the bent piece 22 of the bus bar 13. In the inclined surface 32, an accommodation hole (hole) 33 is formed which has a rectangular form in plan view. A part of the electrode plate part 23 of the bent piece 22 is exposed through the accommodation hole 33. The light emitting element 12A for illuminating the seat is attached to the electrode plate part 23 of the bent piece 22 so as to be accommodated in the accommodation hole 33 of the inclined surface 32.

As shown in FIG. 8, the accommodation hole 33 has a form expanding from an inner edge 33a located in the bent piece 22 side to an inner edge 33b located in the inclined surface 32 side. The light emitting element 12A for illuminating the seat accommodated in the accommodation hole 33 is attached so as to be biased to a position of a lower side along the inclined surface 32 in the accommodation hole 33.

The housing 14 has a connector part 41 in a peripheral edge. The connector part 41 has a fitting recessed part 42 opened sideward. In the fitting recessed part 42, the connection terminal part 29 of the bus bar main body 21 is arranged. In the connector part 41, a connector provided in a wire harness of a vehicle is inserted to the fitting recessed part 42. Thus, a terminal part provided in the connector of the wire harness side is electrically conducted and connected to the connection terminal part 29, so that the electric power can be fed to the light emitting element 12.

In the housing 14, tie bar cutting window parts 43 are formed. The tie bar cutting window parts 43 are formed at positions corresponding to tie bars 61 provided in the bus bar 13. The tie bars 61 are cut through the tie bar cutting window parts 43.

In the illumination device 11, when the illuminating switch 28 is pushed down, the electric power is fed to the light emitting element 12A for illuminating the seat so that the light emitting element 12A for illuminating the seat is turned on. Thus, the seat of a side which the illuminating switch 28 is pushed down is illuminated by lights from the light emitting element 12A for illuminating the seat. Then, when the illuminating switch 28 is pushed down again, the light emitting element 12A for illuminating the seat which is turned on is turned off. When a door of the vehicle is opened, the electric power is fed to the light emitting element 12B for illuminating the vehicle interior so that the light emitting element 12B for illuminating the vehicle interior is turned on. Thus, the vehicle interior is illuminated by the lights from the light emitting element 12B for illuminating the vehicle interior. On the other hand, when the door of the vehicle is closed, the light emitting element 12B for illuminating the vehicle interior which is turned on is turned off. The light emitting element 12B for illuminating the vehicle interior can be also turned on or turned off by an operation of another switch (an illustration is omitted).

Now, processes for manufacturing the above-described illumination device 11 will be described below.

FIGS. 9A to 9E are views showing manufacturing processes of the illumination device and respectively perspective views of the illumination device during its production. FIGS. 10A to 10E are views showing the manufacturing processes of the illumination device and respectively plan views of the illumination device during its production.

(Bus Bar Working Process)

Figure 9A:
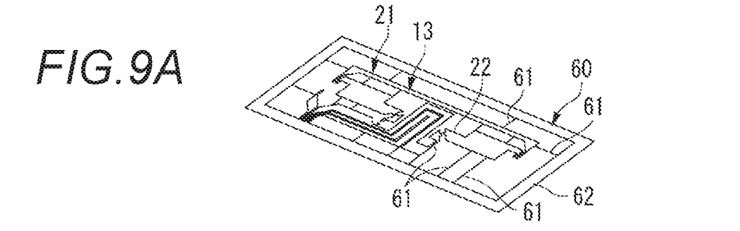
FIGS. 9A to 9E are views showing manufacturing processes of the illumination device and respectively perspective views of the illumination device during its production.
Figure 10A:
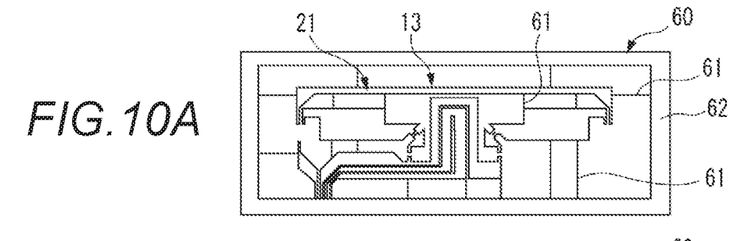
FIGS. 10A to 10E are views showing the manufacturing processes of the illumination device and respectively plan views of the illumination device during its production.

Initially, as shown in FIG. 9A and FIG. 10A, a blanking or stamping work by a press working machine or a cutting work by a laser cutting machine is applied to a metal plate having a prescribed thickness to form a bus bar making body 60 having the bus bars 13. The bus bar making body 60 is formed in such a way that the bus bars 13 are connected to a carrier 62 left in a frame shape in an outer peripheral side by the tie bars 61 and the bus bars 13 are connected together by the tie bars 61. Thus, the bus bars 13 of the bus bar making body 60 can maintain flat plate shaped configurations and spaces between the bus bars 13 can be maintained to prescribed dimensions.

(Bending Working Process)

Figure 9B:
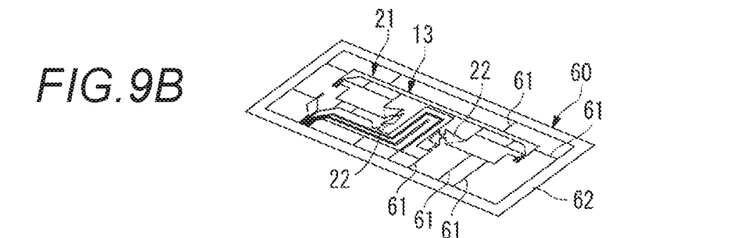
Figure 10B:
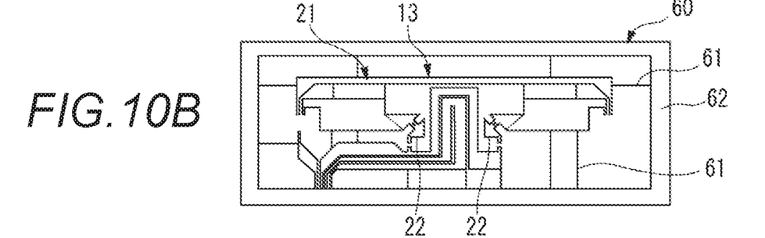

Subsequently, as shown in FIG. 9B and FIG. 10B, a bending work is applied to the bus bar making body 60 by the press working machine to form the inclined bent piece 22 to the bus bar main body 21. At this time, while the space between the electrode plate parts 23 is maintained to have a prescribed size, the bent piece 22 is formed. When the bus bar working process is carried out by the press working machine, the bent piece 22 is preferably formed by the bending work at the same time as the blanking or stamping work.

(Insert Molding Process)

Figure 9C:
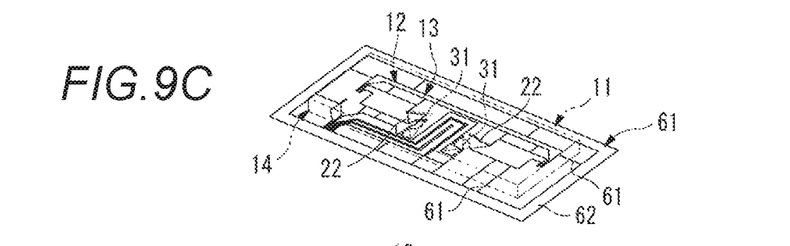
Figure 10C:
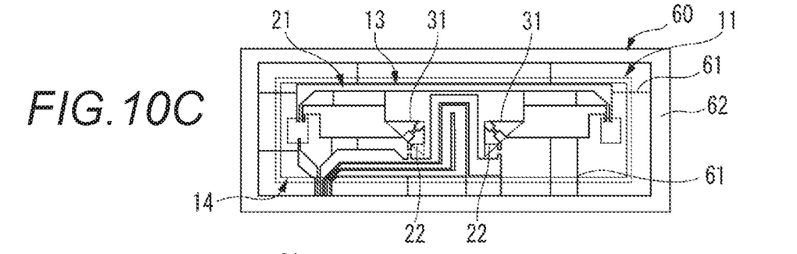

After the bus bar making body 60 is set in a die of an injection molding machine, a resin is injection molded (insert molded) so as to cover the bus bar making body 60. Thus, as shown in FIG. 9C and FIG. 10C, the housing 14 is formed so as to cover the outer periphery of the bus bar 13 of the bus bar main body 60.

(Detaching Process)

Figure 9D:
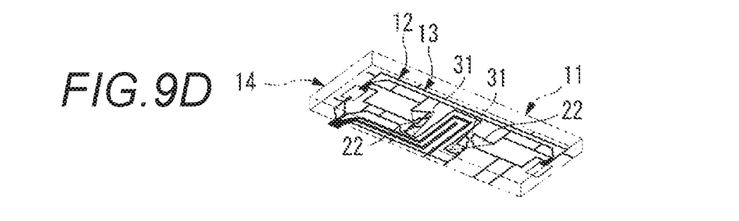
Figure 10D:
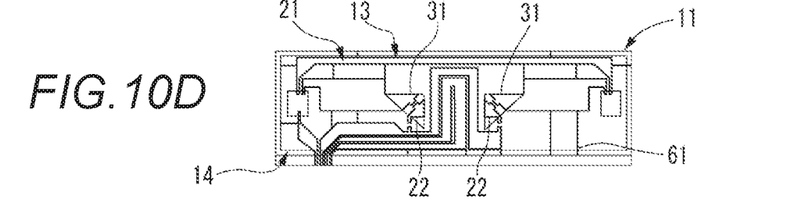

As shown in FIG. 9D and FIG. 10D, the tie bars 61 which connect the bus bars 13 to the carrier 62 are cut to detach the housing 14 including the bus bars 13 from the carrier 62. The tie bars 61 which connect the bus bars 13 together are also cut. The tie bars 61 which connect the bus bars 13 together are cut through the above-described tie bar cutting window parts 43.

(Component Mounting Process)

Figure 9E:
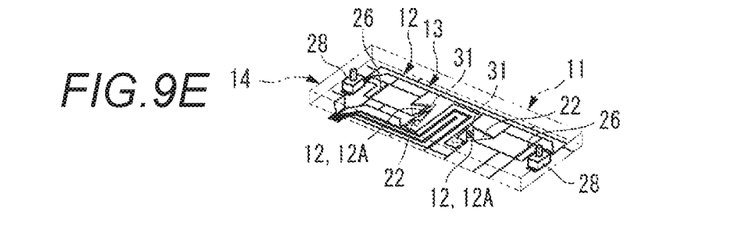
Figure 10E:
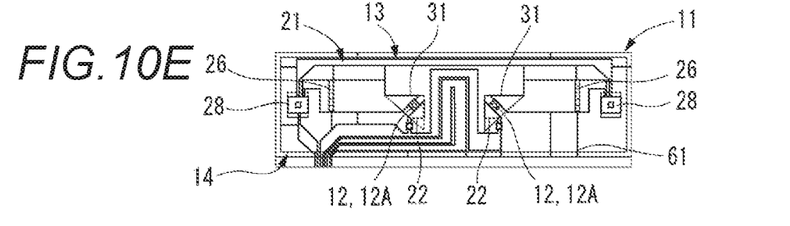

As shown in FIG. 9E and FIG. 10E, the light emitting elements 12, the chip resistances 26 and the illuminating switches 28 are mounted on prescribed positions. The light emitting elements 12, the chip resistances 26 and the illuminating switches 28 are preferably mounted by a re-flow method that solder paste previously stuck to terminals of these components or mounting positions in the bus bar 13 is heated and molten to connect the components to the bus bar 13.

By the above-described processes, the bus bar 13 is insert molded in the housing 14 so that the illumination device 11 may be manufactured in which the light emitting elements 12, the chip resistances 26 and the illuminating switches 28 are mounted on the prescribed positions.

Figure 11:
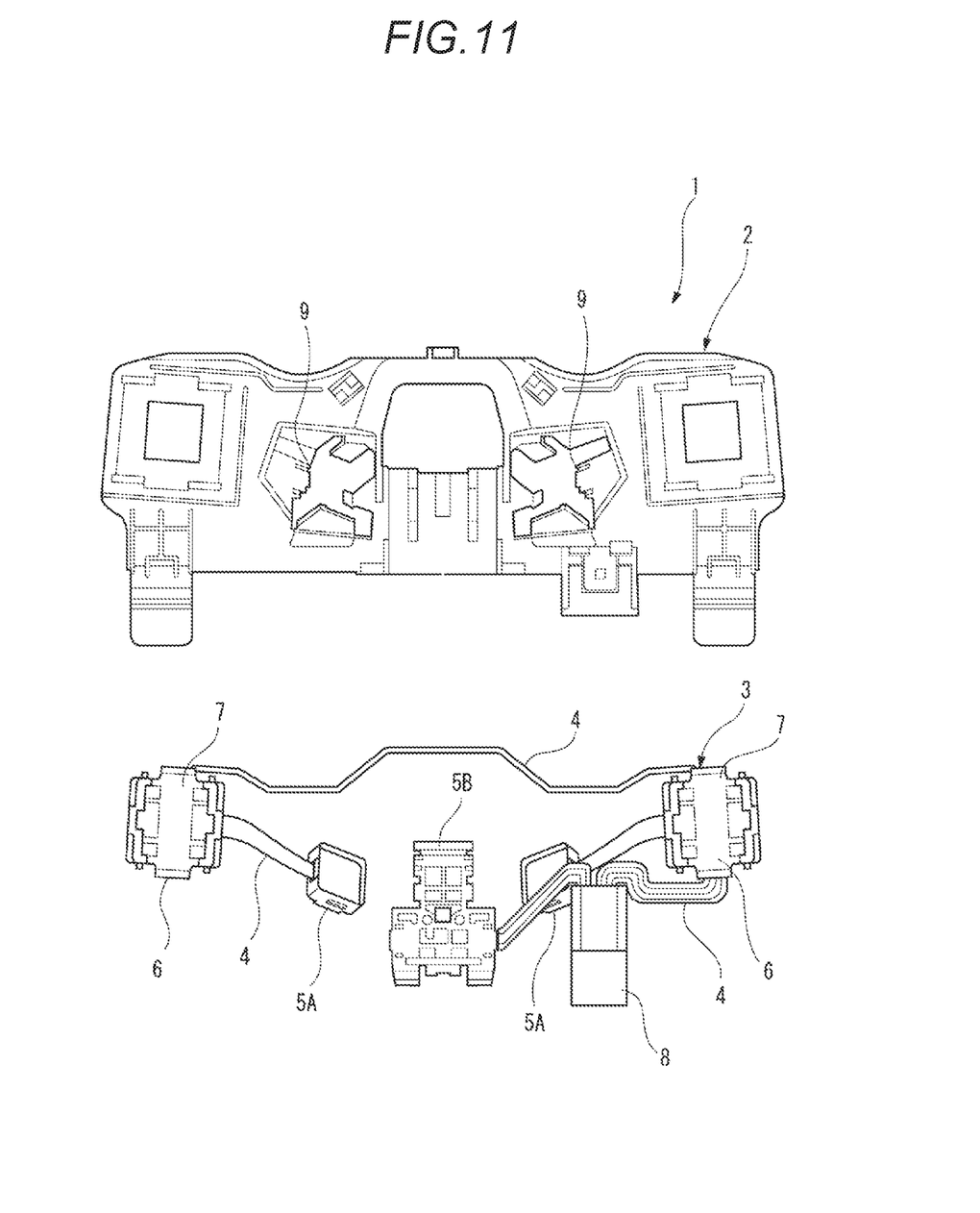
FIG. 11 is a plan view in which an illumination device according to a reference example is disassembled.

FIG. 11 is a plan view in which an illumination device according to a reference example is disassembled.

As shown in FIG. 11, the illumination device 1 according to the reference example includes a case 2 as a molded product of a resin and a wiring member 3 as a separate member from the case 2. The wiring member 3 includes a flexible wiring board 4, a light emitting element 5A for illuminating a seat and a light emitting element 5B for illuminating an interior provided in the flexible wiring board 4. To the flexible wiring board 4, an illuminating switch 6, a chip resistance 7 and a connector 8 are connected. The illumination device 1 of the reference example is formed by attaching the wiring member 3 to the case 2. In the case 2, a light emitting element attaching part 9 is formed to which the light emitting element 5A for illuminating the seat is attached. The light emitting element 5A for illuminating the seat is attached to the light emitting element attaching part 9 under an inclined state. Thus, lights from the light emitting element 5A for illuminating the seat are applied to the seat of a vehicle.

In the illumination device 1 according to the reference example, since the wiring member 3 which is the separate member from the case 2 and has a complicated structure is attached to the case 2, the illumination device 1 is limited to its miniaturization and is not good in its assembling property.

As compared with the reference example, according to the illumination device 11 of the present embodiment, the wiring member as the separate member is not necessary. Further, the housing 14 can be arranged near the bus bar 13. Accordingly, the illumination device can be easily made to be compact. Further, the illumination device 11 has the structure in which the bent piece 22 inclined to the bus bar main body 21 is provided, which is different from the flat plate shaped lead frame board, and the light emitting element 12A for illuminating the seat is accommodated in and attached to the accommodation hole 33 to which the bent piece 22 is exposed. Accordingly, the light emitting element 12A for illuminating the seat can be easily mounted so as to be inclined to the bus bar 13 and the light emitting direction of the light emitting element 12A for illuminating the seat can be adjusted toward the seat of the vehicle.

Further, since the protruding part 31 may be provided only in a position where the bent piece 22 is located to increase the thickness of the housing 14, the thickness of an entire part of the housing 14 does not need to be increased. Accordingly, the housing 14 can be miniaturized and a low cost can be achieved.

Further, when the light emitting element 12A for illuminating the seat is accommodated in the accommodation hole 33, the light emitting element 12A for illuminating the seat is guided to a prescribed attaching position by the tapered inner surface of the accommodation hole 33. Accordingly, an accommodating operation of the light emitting element 12A for illuminating the seat in the accommodation hole 33 is easy, so that an efficiency of an assembling operation can be enhanced.

Further, the light emitting element 12A for illuminating the seat is attached so as to be biased to a position of a lower side along the inclined surface 32 in the accommodation hole 33 formed in the inclined surface 32. Accordingly, when the light emitting element 12A for illuminating the seat is soldered to the bus bar 13 by a re-flow method, molten solder is allowed to flow to the lower side of the hole, so that a contact area of the light emitting element 12A for illuminating the seat and molted solder can be increased. As a result, the light emitting element 12A for illuminating the seat can be more easily electrically conducted to the bus bar 13.

Second Embodiment

Now, an illumination device according to a second embodiment will be described below.

As shown in FIGS. 1A and 1B and FIGS. 2A and 2B, an illumination device 11 according to the embodiment includes a light emitting element 12, a bus bar 13 and a housing 14. The illumination device 11 is attached to a ceiling of a vehicle so that a surface side 11a thereof is directed to an interior side of the vehicle.

The light emitting element 12 includes an LED (a Light Emitting Diode) to emit lights when an electric power is fed and output illumination lights. The light emitting element 12 is provided in a surface 11a as a surface of the interior side in the illumination device 11. The light emitting element 12 includes a light emitting element 12A for illuminating a seat and a light emitting element 12B for illuminating a vehicle interior. Specifically, the two light emitting elements 12A for illuminating the seats are provided so as to sandwich a central part in a longitudinal direction on the surface 11a of the illumination device 11 between them. The light emitting element 12B for illuminating the vehicle interior is provided in the central part in the longitudinal direction on the surface 11a of the illumination device 11. The light emitting elements 12A for illuminating the seats are respectively light sources of illumination tools (what is called, map lights) which respectively illuminate a driver's seat and an assistant's seat. The light emitting element 12B for illuminating the vehicle interior is a light source of an illumination tool (a room lamp) which illuminates the vehicle interior.

The bus bar 13 is formed with a metal plate having an electric conductivity, for instance, copper or copper alloy. The bus bar 13 is a wiring for feeding an electric power to the light emitting element 12 and has a prescribed wiring pattern. The bus bar 13 includes a bus bar main body 21 and two bent pieces 22 provided in the bus bar main body 21. The bus bar main body 21 is configured in a flat plate form. The bent piece 22 is extended in the bus bar main body 21. The bent piece 22 is bent so as to be inclined to the bus bar main body 21.

As shown in FIG. 3 and FIG. 4, the bent piece 22 has one pair of electrode plate parts 23. The electrode plate parts 23 are arranged so as to be spaced from each other. The light emitting element 12A for illuminating the seat is provided so as to stride over the electrode plate parts 23 and soldered to the electrode plate parts 23 respectively. The light emitting element 12A for illuminating the seat emits lights when the electric power is fed thereto through the electrode plate parts 23.

The bus bar main body 21 has one pair of electrode plate parts 24 at a position to which the light emitting element 12B for illuminating the vehicle interior is attached. The electrode plate parts 24 are arranged so as to be spaced from each other. The light emitting element 12B for illuminating the vehicle interior is provided so as to stride over the electrode plate parts 24 and soldered to the electrode plate parts 24 respectively. The light emitting element 12B for illuminating the vehicle interior emits lights when the electric power is fed thereto through the electrode plate parts 24.

The bus bar main body 21 has electrode plate parts 25 in the vicinity of both ends of the illumination device 11. As shown in FIG. 5 and FIG. 6, the electrode plate parts 25 are arranged so as to be spaced apart from each other. In the electrode plate parts 25, a plurality of chip resistances 26 are provide so as to stride over the electrode plate parts 25. The chip resistances 26 are soldered to the electrode plate parts 25 respectively.

Further, the bus bar main body 21 has terminal parts 27 for switches at both the end parts of the illumination device 11. In the terminal parts 27 for the switches, illuminating switches 28 are provided. Terminals of the illuminating switches 28 are soldered to the terminal parts 27 for the switches of the bus bar main body 21. The illuminating switches 28 are respectively push-down type switches. When the illuminating switches 28 are operated, the light emitting elements 12A for the seats are turned on or off.

Further, in the bus bar main body 21, connection terminal parts 29 are formed. The connection terminal parts 29 are extended sideward from a part of a peripheral edge in the bus bar main body 21.

The housing 14 is formed with a synthetic resin and integrally formed with the bus bar 13 by insert-molding the bus bar 13. Most of a periphery of the bus bar 13 is covered with the housing 14.

As shown in FIG. 7, the housing 14 has a protruding part 31. The protruding part 31 protrudes from the surface 11*a* so as to cover the bent piece 22 of the bus bar 13. The protruding part 31 has an inclined surface 32. The inclined surface 32 is formed so as to be parallel to the bent piece 22 of the bus bar 13. In the inclined surface 32, an accommodation hole (hole) 33 is formed which has a rectangular form in plan view. A part of the electrode plate part 23 of the bent piece 22 is exposed through the accommodation hole 33. The light emitting element 12A for illuminating the seat is electrically conducted, connected and attached to the electrode plate part 23 of the bent piece 22 so as to be accommodated in the accommodation hole 33 of the inclined surface 32.

As shown in FIG. 8, the accommodation hole 33 has a form expanding from an inner edge 33*a* located in the bent piece 22 side to an inner edge 33*b* located in the inclined surface 32 side. The light emitting element 12A for illuminating the seat accommodated in the accommodation hole 33 is attached so as to be biased to a position of a lower side along the inclined surface 32 in the accommodation hole 33.

The housing 14 has a connector part 41 in a peripheral edge. The connector part 41 has a fitting recessed part 42 opened sideward. In the fitting recessed part 42, the connection terminal part 29 of the bus bar main body 21 is arranged. In the connector part 41, a connector provided in a wire harness of a vehicle is inserted to the fitting recessed part 42. Thus, a terminal part provided in the connector of the wire harness side is electrically conducted and connected to the connection terminal part 29, so that the electric power can be fed to the light emitting element 12.

In the housing 14, tie bar cutting window parts 43 are formed. The tie bar cutting window parts 43 are formed at positions corresponding to tie bars 61 provided in the bus bar 13. The tie bars 61 are cut through the tie bar cutting window parts 43.

Figure 12:
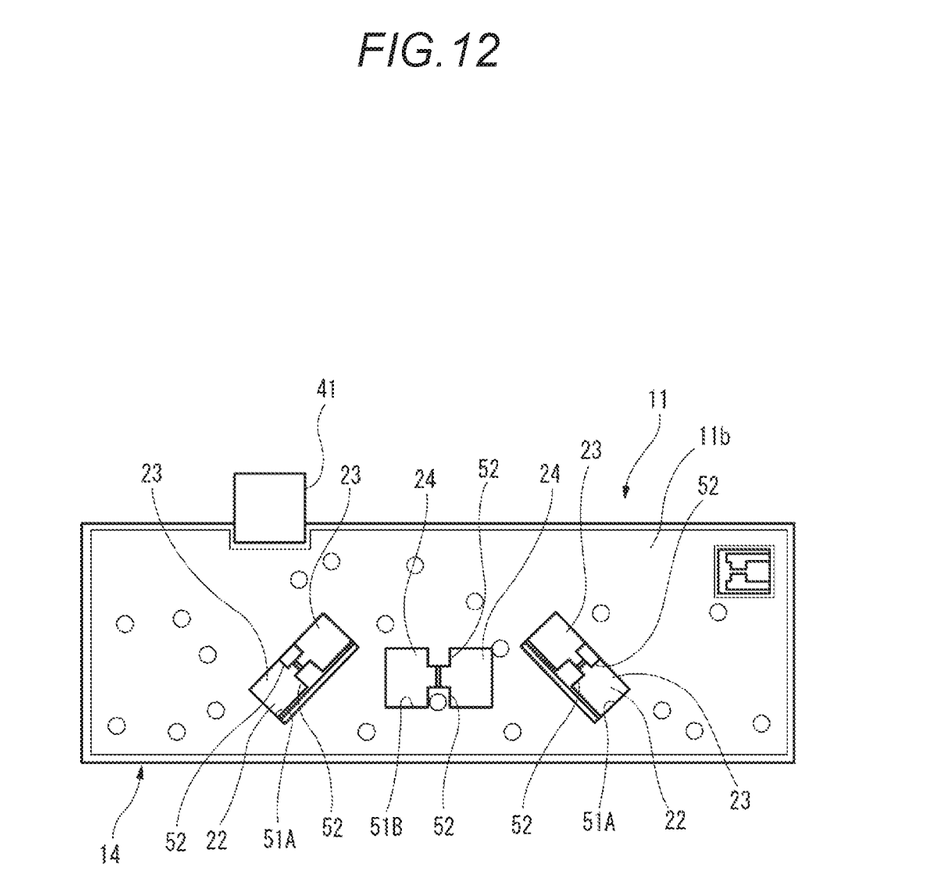
FIG. 12 is a rear view of the illumination device according to an embodiment.

FIG. 12 is a rear view of the illumination device according to the embodiment. As shown in FIG. 12, the housing 14 has exposed holes (holes) 51A and 51B on a back surface 11*b* of the illumination device 11. The exposed hole 51A is formed on the back surface located opposite to a direction in which the bent piece 22 of the bus bar main body 21 is bent.

In the exposed hole 51A, a back surface side of the bent piece 22 of the bus bar main body 21 is exposed. In the exposed hole 51A, one pair of reinforcing protrusion parts 52 are formed. The reinforcing protrusion parts 52 are allowed to protrude to a direction where they come close to each other along the space of the electrode plate parts 23 from edge parts of the exposed hole 51A. By the reinforcing protrusion parts 52, support strength of the bent piece 22 is increased.

The exposed hole 51B is formed on a back surface of the electrode plate parts 24 to which the light emitting element 12B for illuminating the vehicle interior is attached. In the exposed hole 51B, back surface sides of the electrode plate parts 24 of the bus bar main body 21 are exposed. In the exposed hole 51B, one pair of reinforcing protrusion parts 52 are formed. The reinforcing protrusion parts 52 are allowed to protrude to a direction where they come close to each other along the space of the electrode plate parts 24 from edge parts of the exposed hole 51B. By the reinforcing protrusion pats 52, support strength of the electrode plate parts 24 is increased.

In the illumination device 11, when the illuminating switch 28 is pushed down, the electric power is fed to the light emitting element 12A for illuminating the seat so that the light emitting element 12A for illuminating the seat is turned on. Thus, the seat of a side which the illuminating switch 28 is pushed down is illuminated by lights from the light emitting element 12A for illuminating the seat. On the other hand, when the illuminating switch 28 is pushed down again, the light emitting element 12A for illuminating the seat which is turned on is turned off. When a door of the vehicle is opened, the electric power is fed to the light emitting element 12B for illuminating the vehicle interior so that the light emitting element 12B for illuminating the vehicle interior is turned on. Thus, the vehicle interior is illuminated by the lights from the light emitting element 12B for illuminating the vehicle interior. On the other hand, when the door of the vehicle is closed, the light emitting element 12B for illuminating the vehicle interior which is turned on is turned off. The light emitting element 12B for illuminating the vehicle interior can be also turned on or turned off by an operation of another switch (an illustration is omitted).

In the illumination device 11 according to the second embodiment, the wiring member as the separate member is not necessary as described above. Further, the housing 14 can be arranged near the bus bar 13. Accordingly, the illumination device can be easily made to be compact. Further, the illumination device 11 has the structure in which the light emitting element 12A for illuminating the seat is accommodated in and attached to the accommodation hole 33 to which the bent piece 22 inclined to the bus bar main body 21 is exposed. Accordingly, the light emitting element 12A for illuminating the seat can be easily mounted so as to be inclined. Thus, the lights of the light emitting element 12A for illuminating the seat can be directed toward the seat of the vehicle.

Especially, since the exposed hole 51A is formed so that the bent piece 22 is exposed to a back surface located in an opposite direction to the direction in which the bent piece 22 in the housing 14 is bent, heat discharged from the light emitting element 12A for illuminating the seat can be efficiently radiated from the exposed hole 51A through the bent piece 22 which is exposed.

Similarly, since the exposed hole 51B is formed to which the electrode plate parts 24 are exposed in a back surface of a position where the light emitting element 12B for illuminating the vehicle interior in the housing 14 is attached, heat transmitted to the electrode plate parts 24 from the light emitting element 12B for illuminating the vehicle interior can be efficiently radiated from the exposed hole 51B.

The present invention is not limited to the above-described embodiments, and the present invention may be suitably modified and improved. In addition thereto, materials, forms, dimensions, numbers, arranged positions or the like of component elements in the above-described embodiments may be arbitrarily used as long as the present invention can be achieved.

Now, features of the above-described embodiments of the illumination device according to the present invention will be respectively briefly summarized and described in below-described (1) to (5).

(1) An illumination device comprising:
a light emitting element (12),
a bus bar (13) in which the light emitting element is attached, and
a housing (14) in which the bus bar is insert-molded,
wherein the bus bar includes a flat plate shaped bus bar main body (21) and a bent piece (22) extended in the bus bar main body and bent so as to be inclined to the bus bar main body,
wherein the housing includes a hole (an exposed hole 51A, 51B) formed so that the bent piece is exposed on a surface located in a direction where the bent piece is bent, and
wherein the light emitting element is attached to the bent piece so as to be accommodated in the hole.

(2) The illumination device according to the above-described (1),
wherein the housing includes a protruding part (31) which protrudes from the surface so as to cover at least a part of the bent piece and which has an inclined surface (32) parallel to the bent piece, and
wherein the light emitting element is attached to the bent piece so as to be accommodated in the hole formed on the inclined surface.

(3) The illumination device according to the above-described (2),
wherein the hole has a form expanding from an inner edge located in a bent piece side to an inner edge located in an inclined surface side.

(4) The illumination device according to the above-described (2) or (3),
wherein the light emitting element is attached so as to be biased to a position of a lower side along the inclined surface, in the hole formed on the inclined surface.

(5) The illumination device according to any one of the above-described (1) to (4),
wherein the housing includes the hole formed so that the bent piece is exposed in a back surface located in an opposite direction to the direction in which the bent piece is bent.

INDUSTRIAL APPLICABILITY

According to the present invention, the miniaturization can be easily achieved and the illumination lights can be directed to a desired direction. The present invention that exhibits the above-described effects is available for an illumination device in an interior of a motor vehicle.

REFERENCE SIGNS LIST

11 . . . illumination device 12 . . . light emitting element 12A . . . light emitting element for illuminating seat (light emitting element) 12B . . . light emitting element for illuminating vehicle interior (light emitting element) 13 . . . bus bar 14 . . . housing 21 . . . bus bar main body 22 . . . bent piece 31 . . . protruding part 32 . . . inclined surface 33 . . . accommodation hole (hole) 33a, 33b . . . inner edge 51A, 51B . . . exposed hole (hole)

The invention claimed is:
1. An illumination device comprising:
a light emitting element,
a bus bar in which the light emitting element is attached, and
a housing in which the bus bar is insert-molded,
wherein the bus bar includes a bus bar main body which is flat-plate-shaped and a bent piece extended in the bus bar main body and bent so as to be inclined to the bus bar main body,
wherein the housing includes a protruding part which protrudes from a surface covering the bus bar main body so as to cover at least a part of the bent piece and which has an inclined surface parallel to the bent piece, and a hole on the inclined surface of the protruding part formed so that the bent piece is exposed,
wherein the light emitting element is attached to the bent piece so as to be accommodated in the hole, and
wherein the light emitting element is attached so as to be biased to a position of a lower side along the inclined surface, in the hole formed on the inclined surface.

2. The illumination device according to claim 1,
wherein the hole has a form expanding from an inner edge located in a bent piece side to an inner edge located in an inclined surface side.

3. The illumination device according to claim 1,
wherein the housing includes a hole formed so that the bent piece is exposed in a back surface located in an opposite direction to the direction in which the bent piece is bent.

* * * * *